United States Patent
Ward et al.

(10) Patent No.: US 8,053,920 B2
(45) Date of Patent: Nov. 8, 2011

(54) COMPACT TERMINAL ASSEMBLY FOR POWER CONVERTERS

(75) Inventors: Terence G. Ward, Redondo Beach, CA (US); George John, Cerritos, CA (US); Edward P. Yankoski, Corona, CA (US); Gregory S. Smith, Woodland Hills, CA (US); James M. Nagashima, Cerritos, CA (US)

(73) Assignee: GM Global Technology Operations LLC, Detroit, MI (US)

( * ) Notice: Subject to any disclaimer, the term of this patent is extended or adjusted under 35 U.S.C. 154(b) by 598 days.

(21) Appl. No.: 12/178,897

(22) Filed: Jul. 24, 2008

(65) Prior Publication Data

US 2009/0034310 A1 Feb. 5, 2009

Related U.S. Application Data

(60) Provisional application No. 60/952,780, filed on Jul. 30, 2007.

(51) Int. Cl.
*B60L 1/00* (2006.01)
(52) U.S. Cl. .................................................. 307/9.1
(58) Field of Classification Search ............. 307/9.1; 361/600, 601, 627, 637, 641, 679.01, 826.823; 363/34, 123
See application file for complete search history.

(56) References Cited

U.S. PATENT DOCUMENTS

| | | | |
|---|---|---|---|
| 5,552,976 A | 9/1996 | Munro et al. | |
| 6,154,383 A | 11/2000 | Cardwell, Jr. | |
| 6,178,514 B1 * | 1/2001 | Wood | 713/300 |
| 6,310,468 B1 | 10/2001 | Feldtkeller | |
| 7,224,145 B2 | 5/2007 | Pierret et al. | |
| 7,323,860 B2 * | 1/2008 | Kaneda | 324/117 H |
| 7,560,887 B2 | 7/2009 | Pierret et al. | |
| 7,683,511 B2 * | 3/2010 | Iwashima et al. | 310/68 R |
| 7,742,303 B2 * | 6/2010 | Azuma et al. | 361/699 |
| 7,872,383 B2 | 1/2011 | Dubuc et al. | |
| 7,932,649 B2 | 4/2011 | Dubuc et al. | |

OTHER PUBLICATIONS

Office Action mailed Dec. 8, 2010, issue in U.S. Appl. No. 12/178,865.
Final Office Action mailed May 26, 2011 for U.S. Appl. No. 12/178,865.
Office Action mailed Jun. 23, 2011 for U.S. Appl. No. 12/891,316.

* cited by examiner

*Primary Examiner* — Albert W Paladini
(74) *Attorney, Agent, or Firm* — Ingrassia Fisher & Lorenz, P.C.

(57) ABSTRACT

A terminal assembly for a power converter is provided. The terminal assembly includes first and second conductive components and a current sensor. The first conductive component has first and second releasable attachment formations. The second conductive component has first and second portions with respective first and second widths. The first width is less than the second width. The first portion is releasably attached to the first conductive component with the second releasable attachment formation. The current sensor has an opening therethrough and is positioned between the first conductive component and the second portion of the second conductive component such that the first portion of the first conductive component extends through the opening. The current sensor is responsive to current flowing through the first portion of the second conductive component.

20 Claims, 9 Drawing Sheets

COMPACT TERMINAL ASSEMBLY FOR POWER CONVERTERS

CROSS-REFERENCE TO RELATED APPLICATION

This application claims the benefit of U.S. provisional patent application Ser. No. 60/952,780, filed Jul. 30, 2007 (the entire content of which is incorporated by reference herein).

TECHNICAL FIELD

The present invention generally relates to power terminals power converters, and more particularly relates to a terminal assembly for automotive power converters.

BACKGROUND OF THE INVENTION

In recent years, advances in technology, as well as ever-evolving tastes in style, have led to substantial changes in the design of automobiles. One of the changes involves the complexity of the electrical systems within automobiles, particularly alternative fuel vehicles, such as hybrid, electric, and fuel cell vehicles. Such alternative fuel vehicles typically use one or more electric motors, perhaps in combination with another actuator, to drive the wheels. Additionally, such automobiles may also include other motors, as well as other high voltage components, to operate the other various systems within the automobile, such as the air conditioner.

Due to the fact that alternative fuel automobiles typically include only direct current (DC) power supplies, direct current-to-alternating current (DC/AC) inverters (or power inverters) are provided to convert the DC power to alternating current (AC) power, which is generally required by the motors. Such vehicles, particularly fuel cell vehicles, also often use two separate voltage sources, such as a battery and a fuel cell, to power the electric motors that drive the wheels. Thus, power converters, such as direct current-to-direct current (DC/DC) converters, are typically also provided to manage and transfer the power from the two voltage sources.

As the power demands on the electrical systems in alternative fuel vehicles continue to increase, there is an ever increasing need to maximize the efficiency and reliability of such systems. Additionally, there is a constant desire to reduce the space required by the components within the electrical systems in order to minimize the overall cost and weight of the vehicles.

A need exists for a new inverter design with a high current angled terminal. No known terminal existed with the following attributes; high current, compact design, right angle, current sensor mount, electrically isolated, sealed for vacuum and pressure, capable of clamping to motor power leads.

Therefore, it is desirable to provide a terminal with attributes of high current, compact design, angled, current sensor mount, electrically isolated, sealed for vacuum and pressure, and capable of clamping to motor power leads. Moreover, it is desirable to minimize volume of an inverter/motor. Furthermore, other desirable attributes, features and characteristics of the present invention will become apparent from the subsequent description taken in conjunction with the accompanying drawings and the foregoing technical field and background.

SUMMARY OF THE INVENTION

A terminal assembly for a power converter is provided. The terminal assembly includes first and second conductive components and a current sensor. The first conductive component has first and second releasable attachment formations. The second conductive component has first and second portions with respective first and second widths. The first width is less than the second width. The first portion is releasably attached to the first conductive component with the second releasable attachment formation. The current sensor has an opening therethrough and is positioned between the first conductive component and the second portion of the second conductive component such that the first portion of the first conductive component extends through the opening. The current sensor is responsive to current flowing through the first portion of the second conductive component.

A terminal assembly for an automotive power converter is provided. The terminal assembly includes first and second conductive components and a current sensor. The first conductive component has first and second releasable attachment formations. The second conductive component has first and second portions with respective first and second widths. The first width is less than the second width. The first portion is releasably attached to the first conductive component with the second releasable attachment formation. The current sensor has an opening therethrough and is positioned between the first conductive component and the second portion of the second conductive component such that the first portion of the first conductive component extends through the opening. The current sensor is responsive to current flowing through the first portion of the second conductive component. The first and second conductive components are shaped such that current flowing into the first conductive component at the first releasable attachment formation towards the second releasable attachment formations and into the first portion of the second conductive component flows substantially in a first direction and current flowing from first portion of the second conductive component towards the second portion of the second conductive component flows substantially in a second direction, an angle between the first and second directions being at least 90 degrees.

An automotive drive system is provided. The automotive drive assembly includes an electric motor, a housing, a direct current (DC) power supply, a power inverter, a terminal assembly, and a processor. The electric motor has a lead extending therefrom. The housing is coupled to the electric motor. The DC power supply is coupled to the electric motor. The power inverter has an inverter module coupled to the housing, the electric motor, and the DC power supply to receive DC power from the DC power supply and provide alternating current (AC) power to the electric motor. The terminal assembly interconnects the inverter module and includes first and second conductive components and a current sensor. The first conductive component has first and second releasable attachment formations. The first releasable attachment formation is releasably attached to the inverter module. The second conductive component has first and second portions with respective first and second widths. The first width is less than the second width. The first portion is releasably attached to the first conductive component with the second releasable attachment formation. The second portion is coupled to the lead. The current sensor has an opening therethrough and is positioned between the first conductive component and the second portion of the second conductive component such that the first portion of the first conductive component extends through the opening. The current sensor is responsive to current flowing through the first portion of the second conductive component. The processor is in operable communication with and configured to control the electric motor, the DC power supply, and the power inverter.

DESCRIPTION OF THE DRAWINGS

The present invention will hereinafter be described in conjunction with the following drawing figures, wherein like numerals denote like elements.

DESCRIPTION OF AN EXEMPLARY EMBODIMENT

The following detailed description is merely exemplary in nature and is not intended to limit the invention or the application and uses of the invention. Furthermore, there is no intention to be bound by any expressed or implied theory presented in the preceding technical field, background, and brief summary, or the following detailed description.

The following description refers to elements or features being "connected" or "coupled" together. As used herein, "connected" may refer to one element/feature being mechanically joined to (or directly communicating with) another element/feature, and not necessarily directly. Likewise, "coupled" may refer to one element/feature being directly or indirectly joined to (or directly or indirectly communicating with) another element/feature, and not necessarily mechanically. However, it should be understood that although two elements may be described below, in one embodiment, as being "connected," in alternative embodiments similar elements may be "coupled," and vice versa. Thus, although the schematic diagrams shown herein depict example arrangements of elements, additional intervening elements, devices, features, or components may be present in an actual embodiment.

Further, various components and features described herein may be referred to using particular numerical descriptors, such as first, second, third, etc., as well as positional and/or angular descriptors, such as horizontal and vertical. However, such descriptors may be used solely for descriptive purposes relating to drawings and should not be construed as limiting, as the various components may be rearranged in other embodiments. It should also be understood that FIGS. 1-11 are merely illustrative and may not be drawn to scale.

FIG. 1 to FIG. 11 illustrate a terminal assembly for a power converter (e.g., a power inverter). The terminal assembly includes first and second conductive components and a current sensor. The first conductive component has first and second releasable attachment formations. The second conductive component has first and second portions with respective first and second widths. The first width is less than the second width. The first portion is releasably attached to the first conductive component with the second releasable attachment formation. The current sensor has an opening therethrough and is positioned between the first conductive component and the second portion of the second conductive component such that the first portion of the first conductive component extends through the opening. The current sensor is responsive to current flowing through the first portion of the second conductive component.

Figure 1:
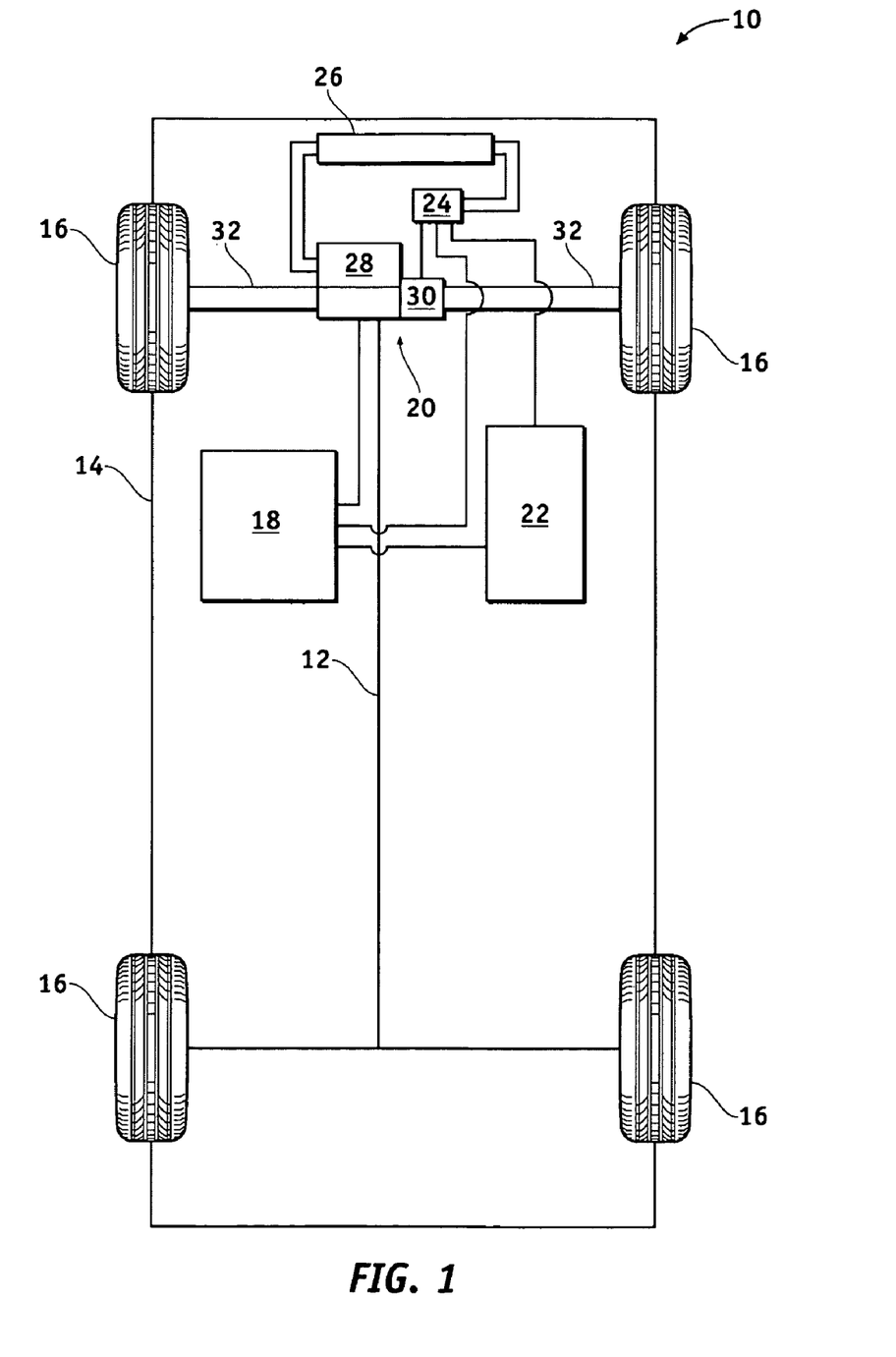
FIG. 1 is a schematic view of an exemplary automobile according to one embodiment of the present invention.

FIG. 1 illustrates a vehicle (or "automobile") 10, according to one embodiment of the present invention. The automobile 10 includes a chassis 12, a body 14, four wheels 16, and an electronic control system 18. The body 14 is arranged on the chassis 12 and substantially encloses the other components of the automobile 10. The body 14 and the chassis 12 may jointly form a frame. The wheels 16 are each rotationally coupled to the chassis 12 near a respective corner of the body 14.

The automobile 10 may be any one of a number of different types of automobiles, such as, for example, a sedan, a wagon, a truck, or a sport utility vehicle (SUV), and may be two-wheel drive (2WD) (i.e., rear-wheel drive or front-wheel drive), four-wheel drive (4WD), or all-wheel drive (AWD). The automobile 10 may also incorporate any one of, or combination of, a number of different types of engines, such as, for example, a gasoline or diesel fueled combustion engine, a "flex fuel vehicle" (FFV) engine (i.e., using a mixture of gasoline and alcohol), a gaseous compound (e.g., hydrogen and/or natural gas) fueled engine, a combustion/electric motor hybrid engine, and an electric motor.

In the exemplary embodiment illustrated in FIG. 1, the automobile 10 is a hybrid vehicle, and further includes an actuator assembly 20, a battery (or direct current (DC) power supply) 22, a power inverter assembly (or inverter) 24, and a radiator 26. The actuator assembly 20 includes a combustion engine 28 and an electric motor/generator (or motor) 30. As will be appreciated by one skilled in the art, the electric motor 30 includes a transmission therein, and although not illustrated also includes a stator assembly (including conductive coils), a rotor assembly (including a ferromagnetic core), and a cooling fluid (i.e., coolant). The stator assembly and/or the rotor assembly within the electric motor 30 may include multiple electromagnetic poles (e.g., sixteen poles), as is commonly understood.

Still referring to FIG. 1, in one embodiment, the combustion engine 28 and the electric motor 30 are integrated such that both are mechanically coupled to at least some of the wheels 16 through one or more drive shafts 32. The radiator 26 is connected to the frame at an outer portion thereof and although not illustrated in detail, includes multiple cooling channels therein that contain a cooling fluid (i.e., coolant) such as water and/or ethylene glycol (i.e., "antifreeze") and is coupled to the engine 28 and the inverter 24.

Figure 2:
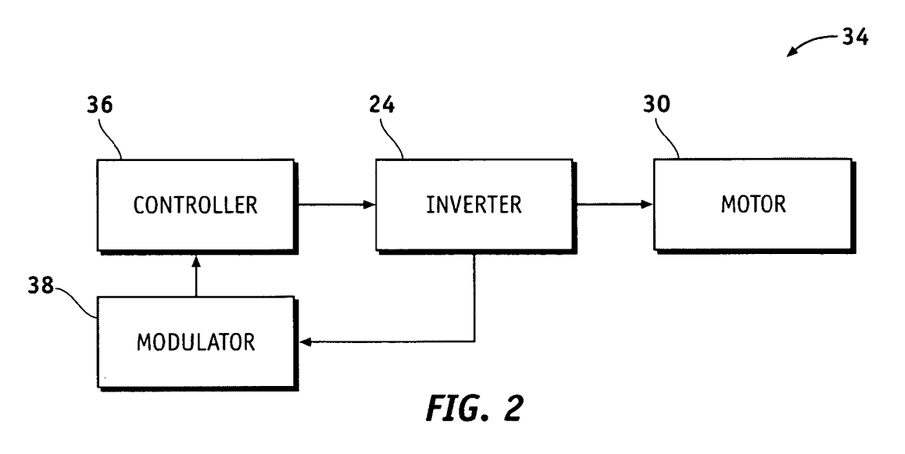
FIG. 2 is a block diagram of a voltage source inverter system within the automobile of FIG. 1.

Referring to FIG. 2, a voltage source inverter system (or electric drive system) 34 is shown in accordance with an exemplary embodiment of the present invention. The voltage source inverter system 34 includes a controller 36 coupled to an output of a modulator 38, which in turn has an input coupled to a first output of the inverter 24. The controller 36 has an output coupled to an input of the inverter 24, which has a second output coupled to the motor 30. The controller 36 and the modulator 38 may be integral with the electronic control system 18 shown in FIG. 1.

Figure 3:
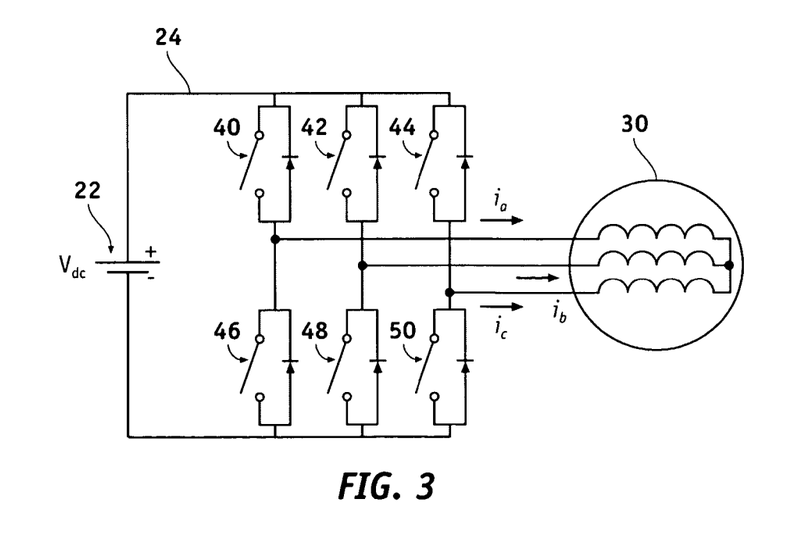
FIG. 3 is a schematic view of an inverter within the automobile of FIG. 1.

FIG. 3 schematically illustrates the inverter 24 of FIGS. 1 and 2 in greater detail. The inverter 24 includes a three-phase circuit coupled to the motor 30. More specifically, the inverter 24 includes a switch network having a first input coupled to a voltage source $V_{dc}$ (e.g., the battery 22) and an output coupled to the motor 30. Although a single voltage source is shown, a distributed DC link with two series sources may be used.

The switch network comprises three pairs (a, b, and c) of series switches with antiparallel diodes (i.e., antiparallel to each switch) corresponding to each of the phases of the motor 30. Each of the pairs of series switches comprises a first switch, or transistor, (i.e., a "high" switch) 40, 42, and 44 having a first terminal coupled to a positive electrode of the voltage source 22 and a second switch (i.e., a "low" switch) 46, 48, and 50 having a second terminal coupled to a negative electrode of the voltage source 22 and a first terminal coupled to a second terminal of the respective first switch 40, 42, and 44.

Figure 4:
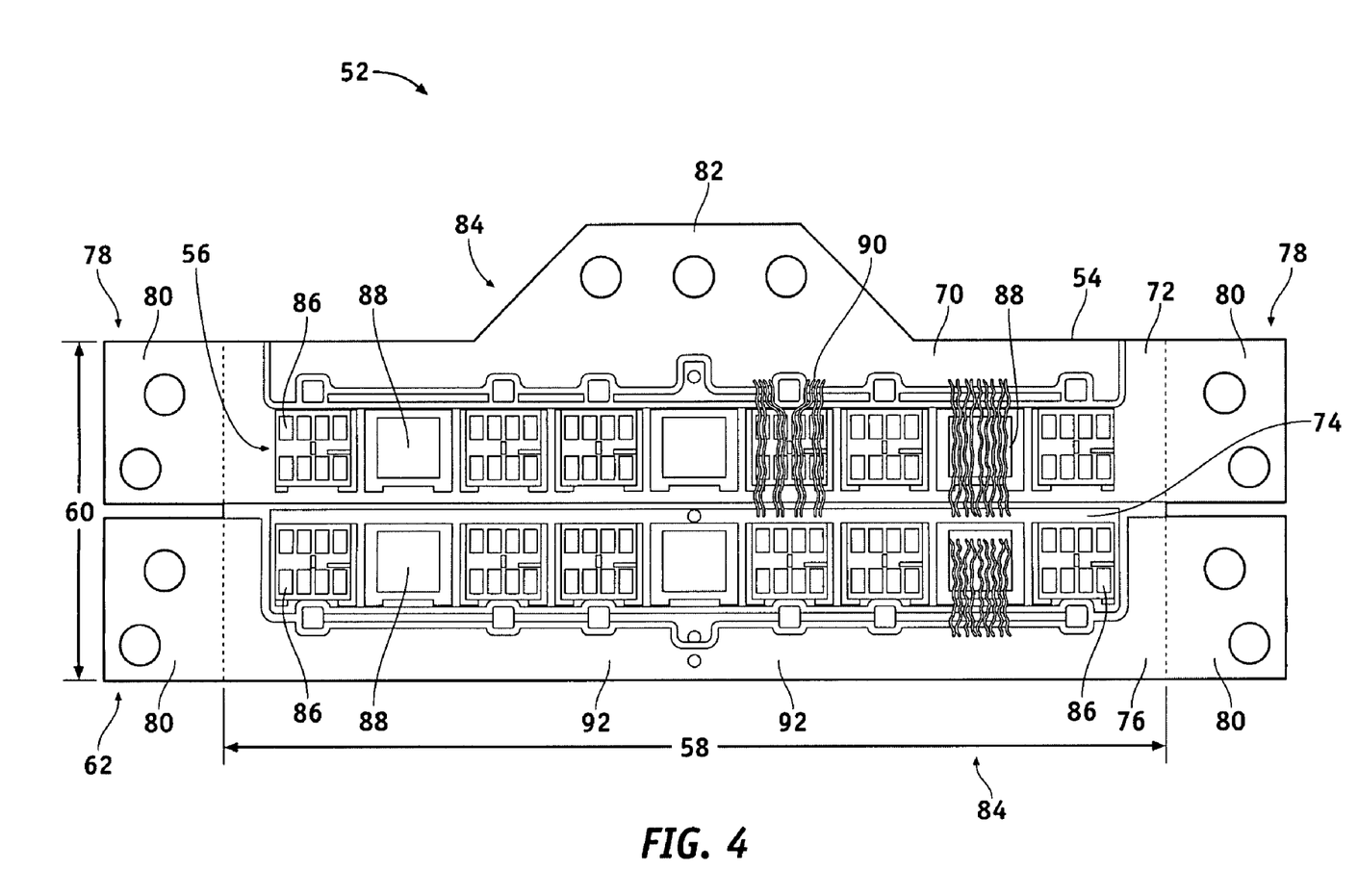
FIG. 4 is a plan view of an upper surface of an inverter module within the inverter of FIG. 3 according to one embodiment of the present invention.
Figure 5:
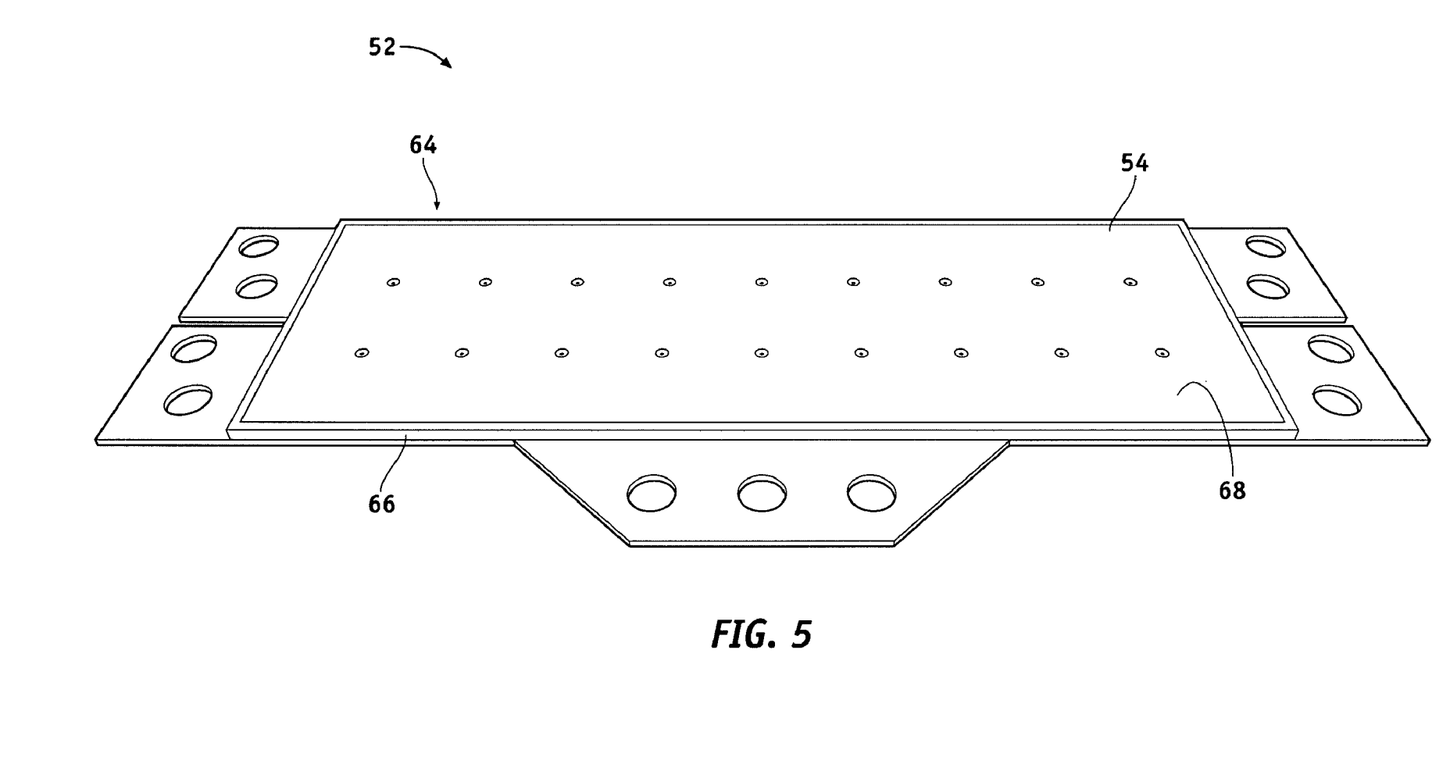
FIG. 5 is a perspective view of a lower surface of the inverter module of FIG. 4.

FIGS. 4 and 5 illustrate an inverter (or power) module 52 of the inverter assembly 24 according to one embodiment of the invention. The inverter module 52 includes a substrate 54 and multiple electronic devices 56 on the substrate 54. The substrate 54 is substantially rectangular with, for example, a length 58 between 100 and 120 millimeters (mm), a width 60 between 20 and 30 mm, and a thickness (not shown) of between 1 and 5 mm. The substrate 54 has an upper surface 62 and a lower surface 64 and, in one embodiment, is a direct bonded copper (DBC) substrate, as is commonly understood, with a ceramic core 66 (e.g., alumina or aluminum nitride) and copper layers 68 formed on, or bonded to, opposing sides (i.e., the upper and lower surfaces 62 and 64) of the core 66.

Referring to FIG. 4, the copper layer 68 on the upper surface 62 is etched to form various conductive members (e.g., bus bars) 70, 72, 74, and 76 substantially extending between opposing ends 78 of the substrate 54. As shown, DC terminals 80 are connected to bus bars 72 and 76 at the opposing ends 78 of the inverter module 52, and an alternating current (AC) terminal 82 is connected to bus bar 70 along one of two opposing sides 84 of the inverter module 52.

The electronic devices 56 include two rows of transistor die (or dies) 86 and diode die 88 mounted to bus bars 72 and 74, respectively. The transistor die 86 each include a semiconductor substrate (e.g., silicon substrate) with an integrated circuit formed thereon that includes one or more of the switches in the form of individual semiconductor devices, such as insulated gate bipolar transistors (IGBTs), as is commonly understood.

Still referring to FIG. 4, the inverter module also includes a plurality of wire bonds 90 that interconnect the electronic devices 56 and the bus bars 70, 72, 74, and 76. For illustrative clarity, only some of the wire bonds 90 are shown in FIG. 4. It should be noted that the electrical connections between the die 86 and 88 on bus bar 72 and the DC terminals 80 connected to bus bar 72 are made where the die 86 and 88 are connected to bus bar 72 (i.e., device portions of bus bar 72). However, the electrical connections between the die 86 and 88 on bus bar 74 and the DC terminals connected to bus bar 76 are made via the wire bonds 90 that connect the die 86 and 88 on bus bar 74 to device portions 92 of bus bar 76. Thus, the device portions (i.e., the portions of bus bars 72 and 76) into which DC current flows) are located between the DC terminals 80 of the respective bus bars 72 and 76.

In other words, if the bus bars 72 and 76 are considered to be conductive wires or traces, the DC terminals 80 are connected to the opposing ends of the traces, and the device portions of the bus bars are connected to the traces between the opposing ends. As suggested in FIG. 3, the DC terminals 80 are electrically connected to the battery 22 (FIG. 1), while the AC terminal 82 is electrically connected to the motor 30. It should be noted that each of the electronic devices 56 (e.g., first, second, third, fourth, etc.) may be considered to have a respective device portion 92 on bus bar 72 or 76.

FIG. 5 illustrates the lower surface 64 of the inverter module 52. As shown, the copper layer 68 on the lower surface 64 is etched only around a periphery thereof to form a heat sink or cooling plate that is electrically disconnected from bus bars 70, 72, 74 and 76 and die 86 and 88. Although not specifically shown, the lower surface 64 of the inverter module 52 may be placed into contact with a cooling device, such as a heat sink, or a cold plate through which a cooling fluid is flown, to remove heat produced during operation, as is commonly understood in the art.

Figure 6:
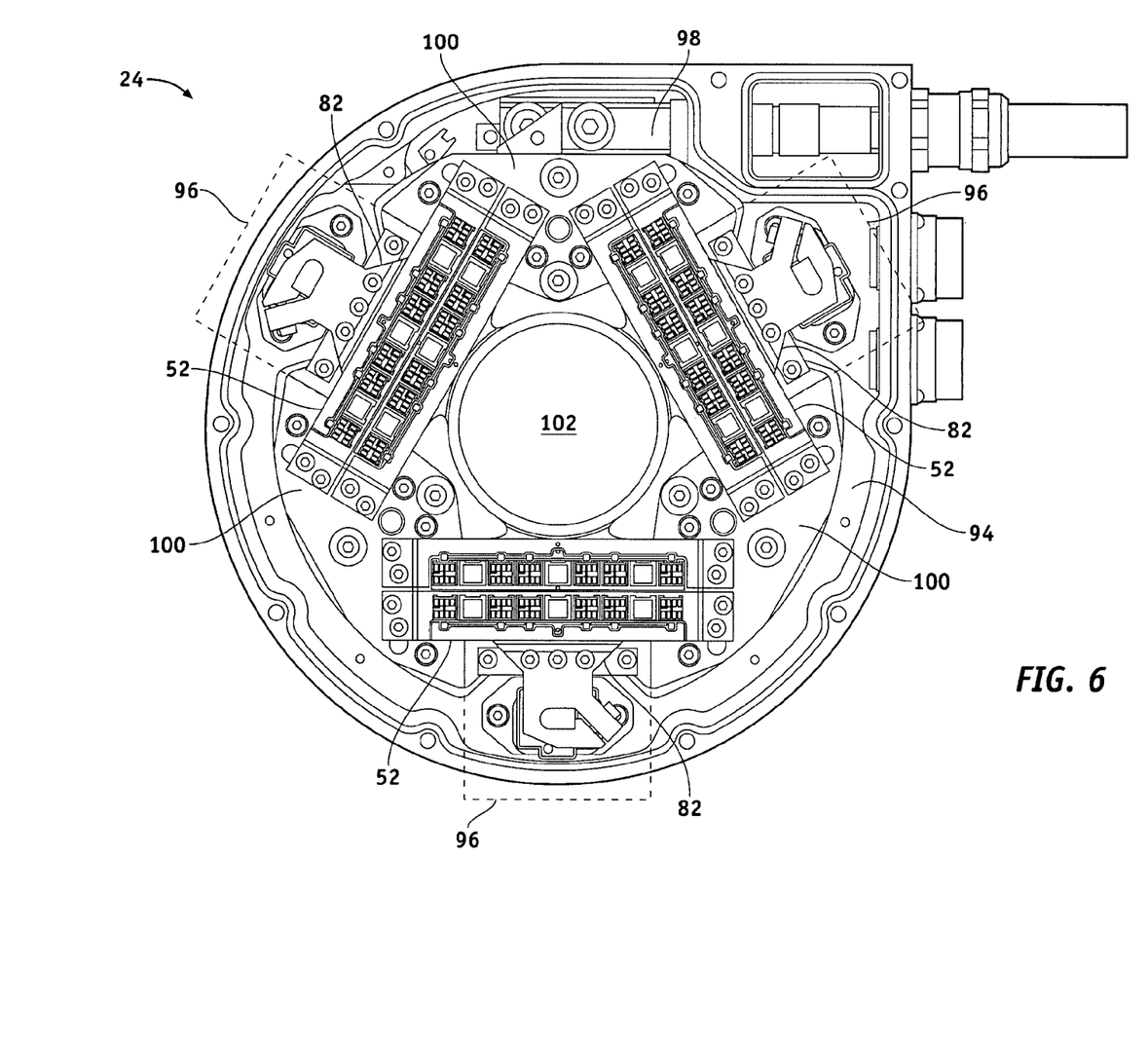
FIG. 6 is a plan view of an inverter assembly according to one embodiment of the present invention.

FIG. 6 illustrates the inverter assembly 24, according to one embodiment of the present invention, in greater detail. The inverter assembly 24 includes a housing (or capacitor housing) 94 and multiple (e.g., three) inverter modules 52, similar to that described above, and terminal assemblies 96. The housing 94 is substantially circular in shape and includes a DC input terminal 98, multiple DC conductors 100, and a motor shaft opening 102. Although not shown in detail, the DC conductors 100 electrically connect the DC input terminal 98 to the DC terminals 80 of the inverter modules 52. The motor shaft opening 102 is circular in shape and is located at a central portion of the housing 94. In one embodiment, the housing 94 is made of a composite or plastic material and includes one or more capacitors therein (not shown). In the depicted embodiment, the inverter modules 52 are symmetrically arranged around the motor shaft opening 102 with the AC terminals 82 thereof facing away from the motor shaft opening 102.

Figure 7:
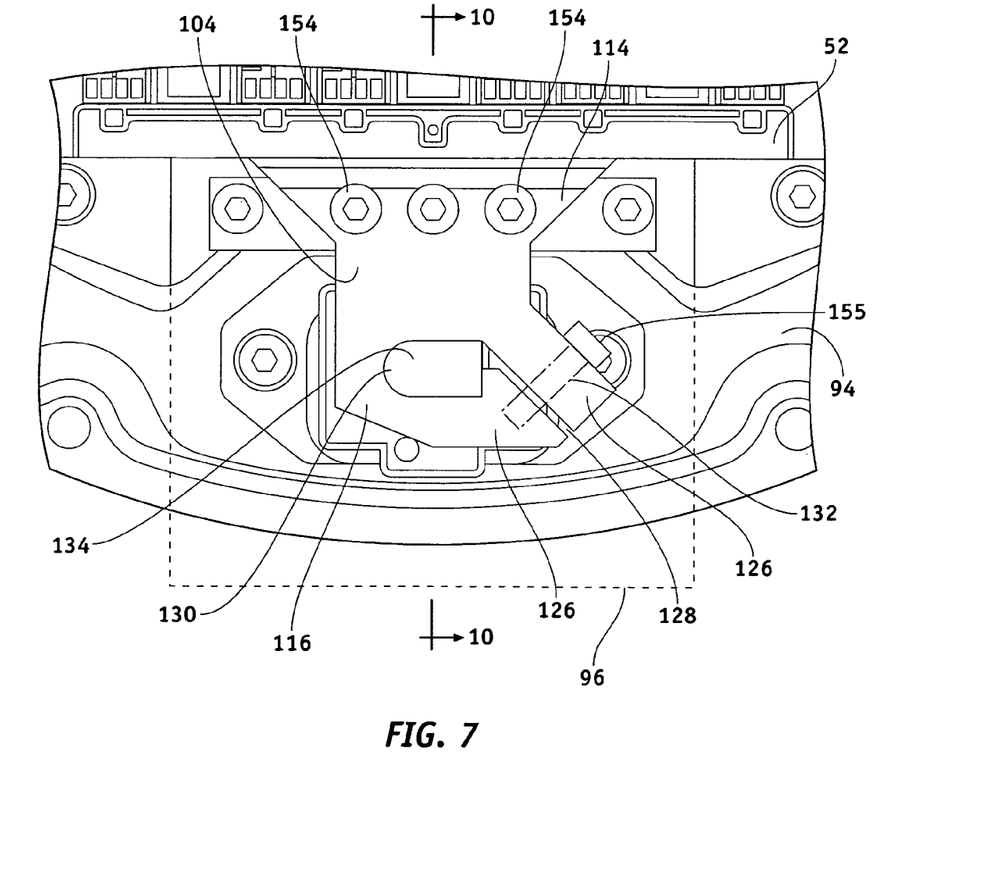
FIG. 7 is a plan view of a terminal assembly within the inverter assembly of FIG. 6.
Figure 8:
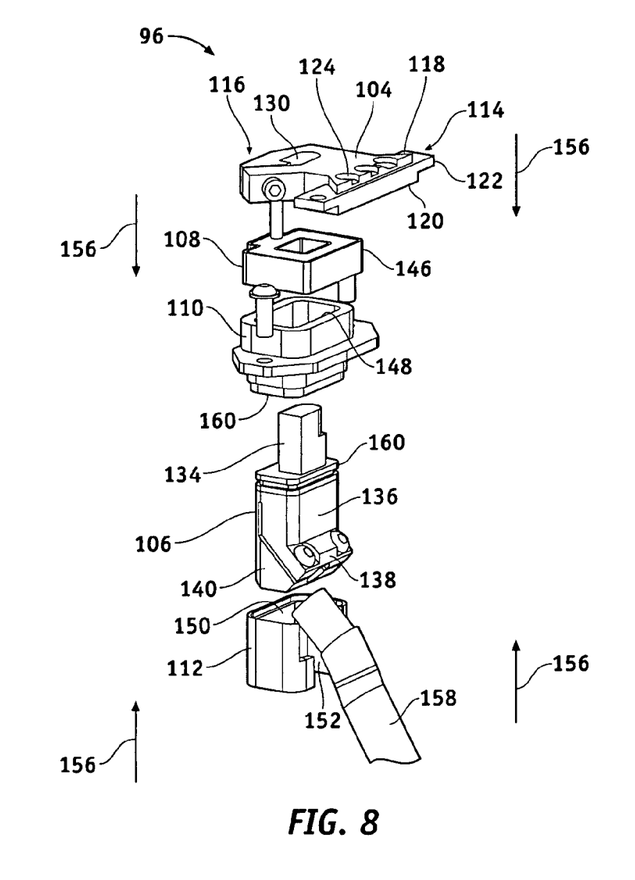
FIGS. 8 and 9 are exploded isometric views of the terminal assembly of FIG. 7.
Figure 9:
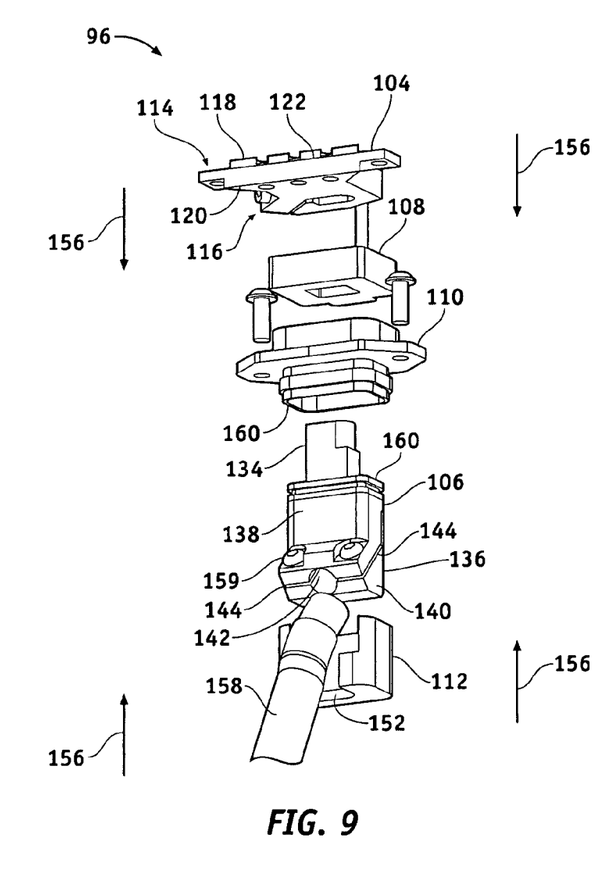

FIGS. 7, 8, and 9 illustrate one of the terminal assemblies 96 in greater detail. Each of the terminal assemblies 96 includes a first (or horizontal) piece 104, a second (or vertical) piece 106, a current sensor 108, an upper isolator (or insulator) 110, and a lower isolator 112. As indicated in FIGS. 7-9, in the depicted embodiment, all of the components 104-112 may have substantially rectangular cross-sections. The first piece (or conductive component) 104 includes an input clamping formation (or input clamp or releasable attachment formation) 114 on one side thereof and an output clamping formation (or output clamp or attachment formation) 116 on an opposing side thereof. The input clamp 114 includes upper and lower portions 118 and 120 on opposing sides of a horizontal slit 122 and threaded holes 124, each extending through both the upper and lower portions 118 and 120. As shown most clearly in FIG. 7, the output clamp 116 includes two clamping members 126 with a vertical slit 128 therebetween and are shaped such that a vertical opening 130 is formed at a central portion thereof. A threaded hole 132 extends at least partially through each of the clamping members 126 across the vertical slit 128.

Referring to FIGS. 8 and 9, the second piece 106 of the terminal assembly 96 includes and input and output portions 134 and 136 at opposing ends thereof. The input portion 134 has a size and shape similar to that of the vertical opening 130 of the first piece 104. Referring to FIG. 9, the output portion 136 includes first and second clamping members 138 and 140 on opposing sides of a lead cavity 142 and lead slits 144 (on opposing sides of the cavity 142). Although not shown in detail, threaded holes extend through the first and second clamping members 138 and 140 across the lead slits 144, in a manner similar to those described above. The first and second pieces 104 and 106 are made of an electrically conductive material, such as copper or aluminum.

Still referring to FIGS. 8 and 9, the current sensor 108 is substantially rectangular in shape and has an opening 146 extending vertically therethrough. The opening 146 has a size and shape similar to that of the vertical opening 130 of the first piece 104 and the input portion 134 of the second piece 106. The current sensor 108 is configured to detect current flowing through the opening 146 (e.g., by detecting the magnetic field caused by a change in the current) and respond to such current by generating a signal representative thereof. Although not shown, the current sensor 108 is in operable communication with the electronic control system 18.

The upper isolator 110 is made of an electrically insulating material, such as a composite or plastic material, and has an opening 148 extending vertically therethrough. The opening 148 through the upper isolator 110 has a size and shape similar to that of the output portion 136 of the second piece 106. The lower isolator 112 is made of a material similar to that of the upper isolator 110 and is shaped to partially enclose a cavity 150, having a size and shape similar to that of a lower portion of output portion 136 of the second piece 106 and a lead opening 152 on one side thereof.

Referring to FIGS. 6-10, when the terminal assembly (or assemblies) 96 is installed, the AC terminal 82 of a respective inverter module 52 is inserted into the horizontal slit 122 of the input clamping formation 114 of the first piece 104 of the terminal assembly 96. Fasteners (e.g., screws or bolts) 154 are inserted through the holes 124 and tightened to cause the upper and lower portions 118 and 120 of the input clamping formation 114 to apply a force onto and the secure the AC terminal 82 within the slit 122. The fasteners 154, as well as the other fasteners described below, may be loosened to release the AC terminal 82 (or other component).

Figure 10:
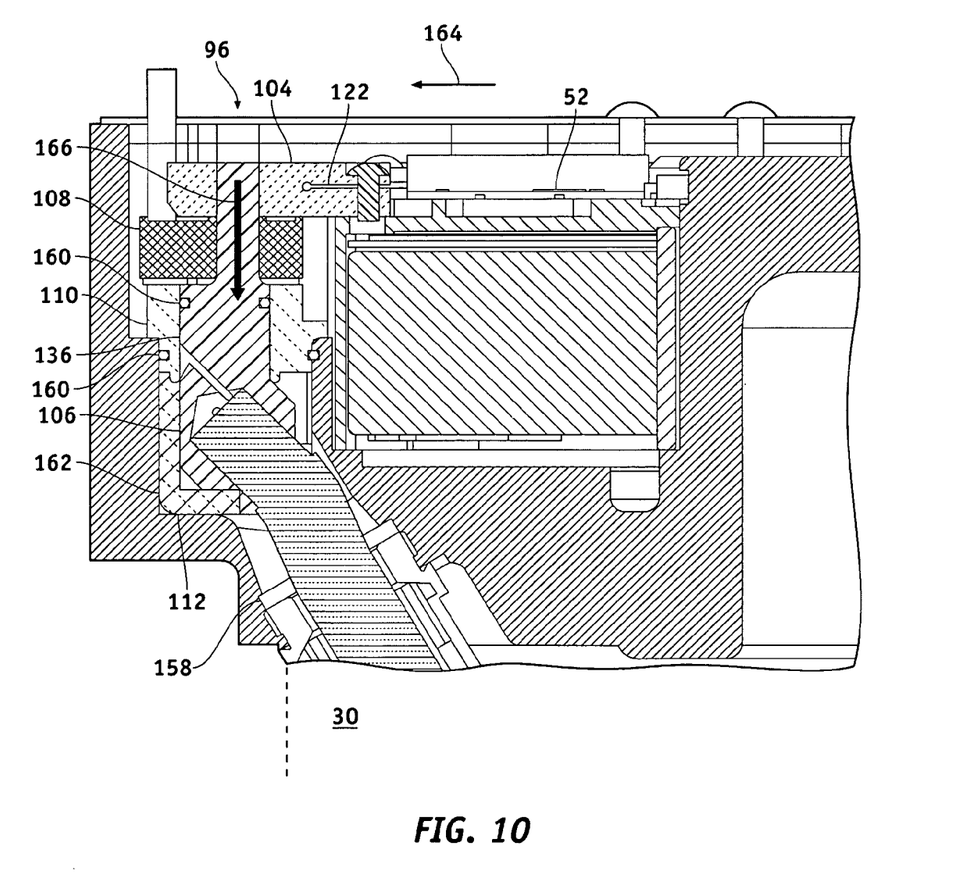
FIG. 10 is a cross-sectional side view of the inverter assembly of FIG. 7 taken along line 10-10.

The remaining components of the terminal assemblies 96 are assembled as indicated by arrows 156 and shown in FIG. 10. The first piece 104 is pressed against the current sensor 108, and the input portion 134 of the second piece 106 is inserted into the openings 130 and 146 of the first piece 104 and the current sensor 108, respectively. A fastener 155 is inserted into the hole 132 and tightened to cause the clamping members 126 to apply a force onto the input portion 134 of the second piece 106 and secure it within the opening 130. As shown in FIG. 7, the output clamp 116 surrounds the input portion 134 of the second piece 106 and contacts the input portion 134 on at least three sides thereof (e.g., virtually the entire periphery, except for at the location of the vertical slit 128).

The current sensor 108 is positioned between (and adjacent to) the first piece 104 and the output portion 136 of the second piece 106. The output portion 136 of the second piece 106 is inserted into the opening 148 of the upper isolator 110 and positioned within the cavity 150 of the lower isolator 112. A lead 158 (e.g., a bundle of wires) from the motor 30 is inserted into the lead opening 152 of the second piece and secured therein via fasteners 159 (FIG. 9), which cause the first and second clamping members 138 and 140 to tighten on the lead 158.

Referring to FIGS. 8-10, seals 160 may be included on the second piece 106 and the upper isolator 110 to seal the output portion 136 of the second piece 106 within the upper isolator 110 and the upper isolator 110 within the housing 94 (e.g., to prevent cooling fluid from passing from passing to the lead 158). As shown in FIG. 10, the terminal assembly 96 is inserted into an upper end of terminal cavity 162 within the housing 94, while the lead 158 of the motor 30 passes into the terminal cavity 162 through a lower end thereof. Although not shown, a drive shaft of the motor 30 may be inserted through the motor shaft opening 102 of the housing 94 (FIG. 6) to mate with the transmission of the automobile 10 (FIG. 1).

Referring to FIGS. 6 and 10, of particular interest is the overall compact design of the inverter assembly 24 and the motor 30 allowed by the arrangement of the inverter modules 52 and the terminal assemblies 96. In particular, the inverter modules 52 are substantially planar members that lay flat against an upper end of the housing 94, and the design of the terminal assemblies 96 allows a substantially right angle to be formed in a conductive member to make electrical contact with the lead 158 of the motor 30. The compactness of the overall assembly is also facilitated by the integrated nature of the current sensor 108, which may be used to monitor the current flowing to the motor 30 and optimize the performance thereof, as will be appreciated by one skilled in the art. That is, because the terminal assembly 96 includes multiple conductive components (e.g., the first and second pieces 104 and 106), which mate as shown in FIGS. 6-10, the current sensor 108 may be easily installed while minimizing the overall length of the conductive member that electrically connects the inverter module 52 to the lead 158.

Referring again to FIG. 1, in the depicted embodiment, the inverter 24 receives and shares coolant with the electric motor 30. The radiator 26 may be similarly connected to the inverter 24 and/or the electric motor 30. The electronic control system 18 is in operable communication with the actuator assembly 20, the battery 22, and the inverter assembly 24. Although not shown in detail, the electronic control system 18 includes various sensors and automotive control modules, or electronic control units (ECUs), such as an inverter control module and a vehicle controller, and at least one processor and/or a memory which includes instructions stored thereon (or in another computer-readable medium) for carrying out the processes and methods as described below. It should also be understood that the electronic control system 18 may include, or be integral with, portions of the inverter assembly 24 shown in FIG. 2, such as the controller 36 and the modulator 38.

During operation, referring to FIGS. 1 and 2, the automobile 10 is operated by providing power to the wheels 16 with the combustion engine 28 and the electric motor 30 in an alternating manner and/or with the combustion engine 28 and the electric motor 30 simultaneously. In order to power the electric motor 30, DC power is provided from the battery 22 (and, in the case of a fuel cell automobile, a fuel cell) to the inverter 24, which converts the DC power into AC power, before the power is sent to the electric motor 30. As will be appreciated by one skilled in the art, the conversion of DC power to AC power is substantially performed by operating (i.e., repeatedly switching) the transistors 33 within the inverter 24 at a "switching frequency" ($F_{sw}$), such as, for example, 12 kilohertz (kHz). Generally, the controller 36 produces a Pulse Width Modulation (PWM) signal for controlling the switching action of the inverter 24. In a preferred embodiment, the controller 36 preferably produces a discontinuous PWM (DPWM) signal having a single zero vector associated with each switching cycle of the inverter 24. The inverter 24 then converts the PWM signal to a modulated voltage waveform for operating the motor 30.

Referring now to FIGS. 3 and 4, the DC current that is provided to the inverter assembly 24 flows into each of the inverter modules 52 at the DC terminals 80. The current then flows toward the center of the inverter module 52 where it is delivered to the various electronic devices 56. Thus, DC current is provided to the electronic devices 56, or more specifically, the device portions 92 of bus bars 72 and 76, from opposing directions. Current also flows from the DC terminals 80 connected to bus bar 72 to the device portions of bus bar 72 in a similar manner.

After passing through the various electronic devices 56 and being converted into AC current, the current flows into bus bar 70 and from the inverter module 52 through the AC terminal 82.

Referring again to FIGS. 6, 7, and 10, the AC current flows from the AC terminal 82 of the inverter module 52 into and through the first piece 104 of the terminal assembly 96, into the input portion 134 of the second piece 106 substantially in a first direction 164. The current passes through the opening 146 of the current sensor 108, through the output portion 136 of the second piece 106, and into the lead 158 of the motor 30 substantially in a second direction 166. Referring specifically to FIG. 10, the first direction 164 is substantially parallel to the lengths (or widths) of the inverter module 52 (i.e., the "plane" of the substrate 54), the slit 122, and the first piece 104 (i.e., as shown in FIG. 10, each of these components has a length that is greater than a thickness thereof). The second direction 166 is substantially parallel to the lengths (or thicknesses) of the input and output portions 134 and 136 of the second piece 106 (i.e., as shown in FIG. 10, each has a length that is greater than a width). An angle between the first and second directions 164 and 166 may be, for example, at least 90 degrees. In the depicted embodiment, the first and second directions 164 and 166 are substantially perpendicular. However, it should be understood that other angles, both less than and greater than 90 degrees, may be used.

Figure 11:
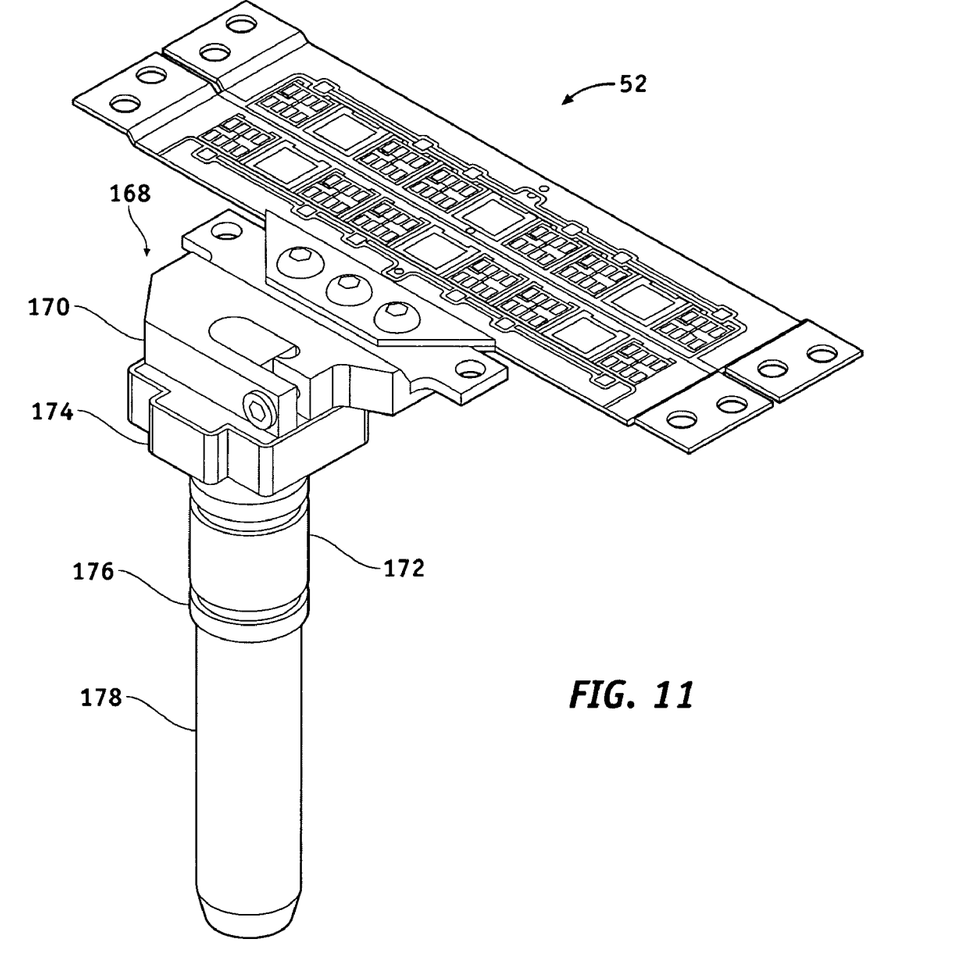
FIG. 11 is an isometric view of an inverter module and a terminal assembly, according to another embodiment of the present invention.

FIG. 11 illustrates an inverter module 52, similar to that described above, and a terminal assembly 168, according to another embodiment of the present invention. The terminal assembly 168 includes (among other components that are not shown) a first piece 170, a second piece 172, and a current sensor 174, similar to those described above. However, although not shown in detail, an output portion 176 of the second piece 172 has a substantially circular cross-section, which as shown, is mated with a motor lead 178. One additional advantage of the embodiment illustrated in FIG. 11 is that because of the circular shape, or cross-section, of the output portion 176 of the second piece 172, installing the terminal assembly 168 and electrically connecting the terminal assembly 168 to the lead 178 may be facilitated. Additionally, the circular shape of the output portion 176 may facilitate the installation of seals around the second piece 172 to prevent cooling fluid from reaching the lead 178.

Other embodiments may utilize different numbers and arrangements of inverter modules, such as six or eight, arranged in various polygons, such as hexagons or octagons.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing the exemplary embodiment or exemplary embodiments. It should be understood that various changes can be made in the function and arrangement of elements without departing from the scope of the invention as set forth in the appended claims and the legal equivalents thereof.

What is claimed is:

1. A terminal assembly for a power converter comprising:
   a first conductive component having a first portion and first and second releasable attachment formations;
   a second conductive component having first and second portions with respective first and second widths, the first width being less than the second width and the first portion being releasably attached to the first conductive component with the second releasable attachment formation; and
   a current sensor having an opening therethrough and being positioned between the first conductive component and the second portion of the second conductive component such that the first portion of the first conductive component extends through the opening, the current sensor being responsive to current flowing through the first portion of the second conductive component.

2. The terminal assembly of claim 1, wherein the first and second conductive components are shaped such that current flowing into the first conductive component at the first releasable attachment formation towards the second releasable attachment formations and into the first portion of the second conductive component flows substantially in a first direction and current flowing from the first portion of the second conductive component towards the second portion of the second conductive component flows substantially in a second direction, an angle between the first and second directions being at least 90 degrees.

3. The terminal assembly of claim 2, wherein the second direction is substantially perpendicular to the first direction.

4. The terminal assembly of claim 2, wherein the first conductive component has a length extending in a direction that is substantially parallel to the first direction and a thickness extending in a direction that is substantially parallel to the second direction, the length of the first conductive component being greater than the thickness thereof.

5. The terminal assembly of claim 4, wherein the second conductive component has a length extending in a direction that is substantially parallel to the second direction and the first and second widths thereof extend in a direction that is substantially parallel to the first direction, the length of the second conductive component being greater than the first and second widths.

6. The terminal assembly of claim 1, wherein the second releasable attachment formation is shaped such that an opening extends therethrough, the opening having a width that is substantially the same as the first width, and the first portion of the second conductive component extending at least partially into the opening.

7. The terminal assembly of claim 6, wherein the opening extends through the attachment formation in a direction that is substantially parallel to the second direction.

8. The terminal assembly of claim 7, wherein the second releasable attachment formation contacts the first portion of the second conductive component on at least three sides thereof.

9. The terminal assembly of claim 2, wherein the first releasable attachment formation is shaped such that a slit extends therethrough, the slit having a length that extends in a direction that is substantially parallel to the first direction and a height that extends in a direction that is substantially parallel to the second direction, the length of the slit being greater than the height.

10. The terminal assembly of claim 1, wherein the current sensor is adjacent to the second releasable attachment formation of the first conductive component and the second portion of the second conductive component.

11. A terminal assembly for an automotive power converter comprising:
    a first conductive component having a first portion and first and second releasable attachment formations;
    a second conductive component having first and second portions with respective first and second widths, the first width being less than the second width and the first portion being releasably attached to the first conductive component with the second releasable attachment formation; and a current sensor having an opening therethrough and being positioned between the first conductive component and the second portion of the second conductive component such that the first portion of the first conductive component extends through the opening, the current sensor being responsive to current flowing through the first portion of the second conductive component, wherein the first and second conductive components are shaped such that current flowing into the first conductive component at the first releasable attachment formation towards the second releasable attachment formations and into the first portion of the second conductive component flows substantially in a first direction and current flowing from first portion of the second conducive component towards the second portion of the second conductive component flows substantially in a second direction, an angle between the first and second directions being at least 90 degrees.

12. The terminal assembly of claim 11, wherein the second releasable attachment formation is shaped such that an opening extends therethrough, the opening having a width that is substantially the same as the first width, and the first portion of the second conductive component extending at least partially into the opening such that the second releasable attachment formation contacts the first portion of the second conductive component on at least three sides thereof.

13. The terminal assembly of claim 12, wherein the first conductive component has a length extending in a direction that is substantially parallel to the first direction and a thickness extending in a direction that is substantially parallel to the second direction, the length of the first conductive component being greater than the thickness thereof and the second conductive component has a length extending in a direction that is substantially parallel to the second direction and the first and second widths thereof extend in a direction that is substantially parallel to the first direction, the length of the second conductive component being greater than the first and second widths.

14. The terminal assembly of claim 13, wherein the second engagement formation comprises first and second members and a fastener interconnecting the first and second members such that a force is applied to the first portion of the second conductive component causing the first portion of the second conductive component to be fixed within the opening.

15. The terminal assembly of claim 14, wherein the second direction is substantially perpendicular to the first direction.

16. An automotive drive system comprising:
an electric motor having a lead extending therefrom;
a housing coupled to the electric motor;
a direct current (DC) power supply coupled to the electric motor;
a power inverter having an inverter module coupled to the housing, the electric motor, and the DC power supply to receive DC power from the DC power supply and provide alternating current (AC) power to the electric motor;
a terminal assembly interconnecting the inverter module and the lead, the terminal assembly comprising:
a first conductive component having a first portion and first and second releasable attachment formations, the first releasable attachment formation being releasably attached to the inverter module;
a second conductive component having first and second portions with respective first and second widths, the first width being less than the second width, the first portion being releasably attached to the first conductive component with the second releasable attachment formation, and the second portion being coupled to the lead; and
a current sensor having an opening therethrough and being positioned between the first conductive component and the second portion of the second conductive component such that the first portion of the first conductive component extends through the opening, the current sensor being responsive to current flowing through the first portion of the second conductive component; and
a processor in operable communication with and configured to control the electric motor, the DC power supply, and the power inverter.

17. The automotive drive system of claim 16, wherein the first and second conductive components are shaped such that current that flowing into the first conductive component at the first releasable attachment formation towards the second releasable attachment formations and into the first portion of the second conductive component flows substantially in a first direction and current flowing from first portion of the second conductive component towards the second portion of the second conductive component flows substantially in a second direction, an angle between the first and second directions being at least 90 degrees.

18. The automotive drive system of claim 17, wherein the at least one inverter module has a substantially planar shape and a width that extends in a direction that is substantially parallel to the first direction and a thickness that extends in a direction that is substantially parallel to the second direction.

19. The automotive drive system of claim 18, wherein the first releasable attachment formation is shaped such that a slit extends therethrough, the slit having a length that extends in a direction that is substantially parallel to the first direction and a height that extends in a direction that is substantially parallel to the second direction, the length of the slit being greater than the height.

20. The automotive drive system of claim 19, wherein the at least one inverter module is at least partially extends into the slit and the first engagement formation comprises first and second members on opposing sides of the slit and a fastener interconnecting the first and second members such that a force is applied to the at least one inverter module causing the inverter module to be fixed within the slit.

* * * * *